Dec. 16, 1958 O. E. DE LANGE 2,864,953

MICROWAVE PULSE CIRCUITS

Filed Oct. 31, 1956

INVENTOR
O. E. DeLANGE
BY Alan C. Rose
ATTORNEY

United States Patent Office 2,864,953

Patented Dec. 16, 1958

2,864,953

MICROWAVE PULSE CIRCUITS

Owen E. De Lange, Rumson, N. J., assignor to Bell Telephone Laboratories, Incorporated, New York, N. Y., a corporation of New York Application October 31, 1956, Serial No. 619,527

11 Claims. (Cl. 250—27)

Figure 1:
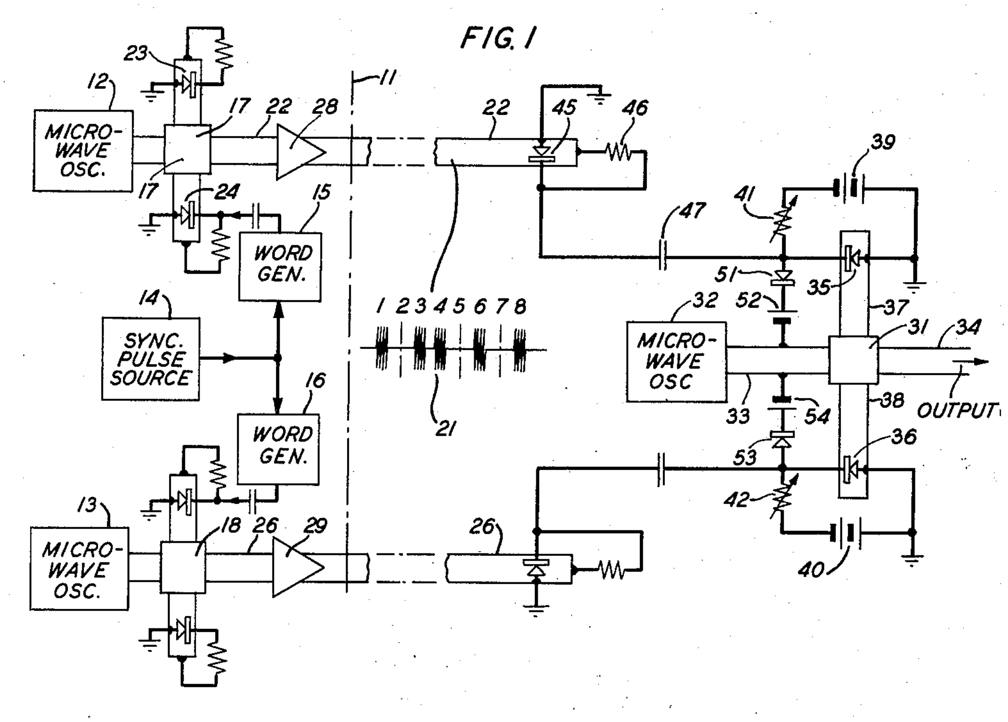

This invention relates to high speed data processing or computer circuitry, and more specifically to junction circuits for microwave pulse signals.

In computer and data processing circuits, it is often desirable to combine two binary input signals to produce different output signals depending on whether the two input signals are the same or are different. Circuits which perform this logic function have been termed "exclusive-Or" circuits, "matching" circuits, or "anticoincidence" circuits. One illustrative type of apparatus in which such circuits are employed is a half-adder, in which the sum output signal may be produced by an exclusive-Or circuit.

The principal object of the invention is to simplify and improve "matching" or "exclusive-Or" circuits for microwave logic circuitry.

In accordance with the present invention, an exclusive-Or circuit for microwave pulse signals includes a hybrid junction with identical diodes in two of its four arms. Two detectors which rectify input microwave pulses from two sources are connected respectively to apply biasing current to control the impedance of the two diodes. Microwave signals are transmitted through the hybrid junction when either signal is present because the impedances presented by the two diodes are different under these circumstances, and the reflected signals do not cancel. When neither or both of the two input signals are present, however, the diodes have the same bias and any applied microwave energy is reflected, rather than coupled to the output arm of the hybrid junction.

In accordance with another aspect of the invention, additional diodes are used for limiting to insure equal energization of the two diodes in the hybrid junction. This circuitry insures proper blocking operation when both input microwave signals are present, but are of unequal intensity.

It is a feature of this invention that a microwave logic circuit comprises a hybrid junction having pairs of conjugate arms with diodes located in each arm of one pair and biased so as normally to present equal impedances and thereby prevent the transmission of microwave energy from one arm of the other pair to the other arm of that other pair. Further in accordance with my invention, logic signals are applied individually to these diodes so that the two arms present unequal impedances if signals are applied to only one of the diodes.

It is another feature of this invention that the signals applied to these diodes be derived by detectors coupled in a pair of wave guides to detect the microwave signal energy in these wave guides.

It is a further feature of this invention that the amplitude of the detected signal applied to these diodes be limited to insure equal energization of the two diodes and therefore equal impedances of the two arms of the hybrid junction when detected signals are applied to both diodes.

Figure 2:
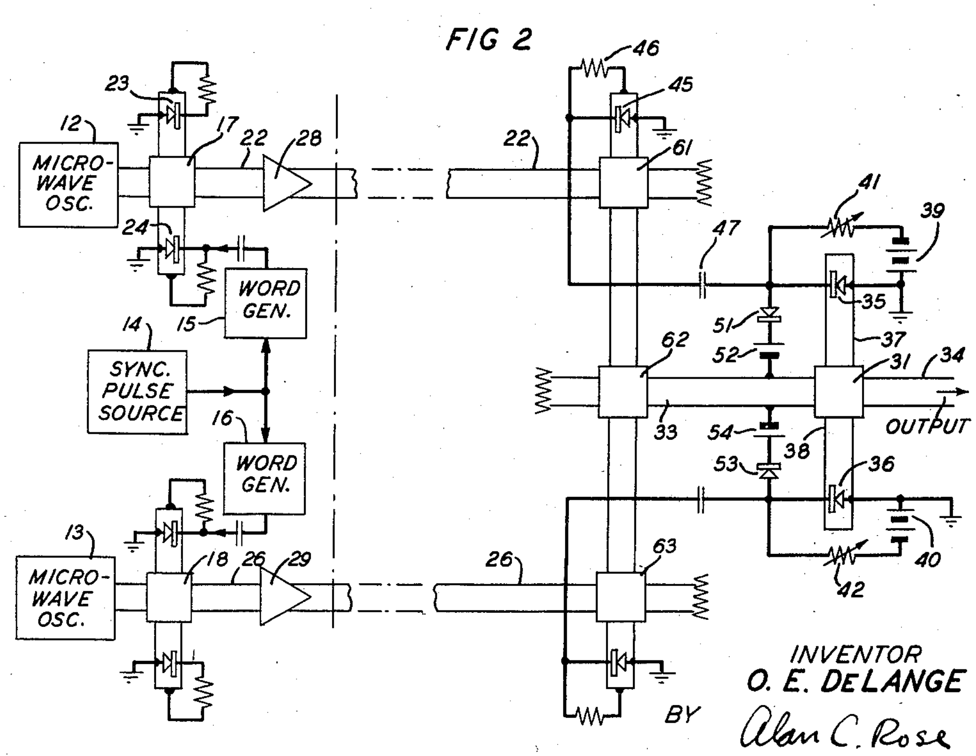

Other objects and features and various advantages of the invention may be readily apprehended from the detailed description, together with the accompanying drawing, in which:

Fig. 1 shows an exclusive-Or or matching circuit in accordance with one specific illustrative embodiment of the invention; and Fig. 2 is an alternative version of the circuit of Fig. 1, in accordance with another specific illustrative embodiment of the invention.

With reference to the drawings, Fig. 1 shows, by way of example, a microwave exclusive-Or circuit and associated pulse generation circuitry. The exclusive-Or circuit per se appears to the right of the dash-dot line 11 in Fig. 1, while the pulse generation circuitry appears to the left of this vertical line. The exclusive-Or circuit is applicable to microwave computer and data processing circuits, such as those disclosed in W. M. Goodall application Serial No. 619,435, filed October 31, 1956 and entitled "Microwave Data Processing Circuits." Although the pulse generation circuitry is described in detail in the Goodall application noted above, for the sake of completeness, it will be reviewed in the next few paragraphs.

Considering the pulse generation circuitry, it includes microwave oscillators 12 and 13, a synchronizing pulse source 14, two word generators 15 and 16, and the hybrid junctions 17 and 18. The microwave oscillators 12 and 13 may, for example, be klystron oscillators, and may have output frequencies of approximately five kilomegacycles. The pulse trains produced by the pulse generation circuits of Fig. 1 have a relatively high pulse repetition rate. For example, the pulse repetition rate of the modulated pulses shown at 21 as associated with wave guide 22 may be from 50,000,000 to over 100,000,000 digits per second.

In serial binary computing apparatus, numbers are characteristically represented by a series of pulses. In general, a series of time slots is established, and binary signals are represented by the presence or absence of pulses in successive time slots. The presence of a pulse in a particular time slot or digit period may correspond to the binary symbol "1," and the absence of a pulse may correspond to the binary symbol "0." The pulses representing a single number or code group appear in a group of consecutive digit periods which is normally designated a "word period."

Referring to Fig. 1, it has been noted that the modulated pulse pattern 21 is present in wave guide 22. The pulse pattern 21 represents an eight-digit "word" corresponding to the binary number 10110101. The correspondence between the pulse pattern 21 and the binary number indicated above may be noted from the presence in the pulse train 21 of pulses in time slots 1, 3, 4, 6, and 8.

The synchronizing pulse source 14 applies pulses to the word generators 15 and 16 simultaneously. The word generators 15 and 16 may, for example, include tapped delay lines through which the synchronizing pulses are transmitted. Diode switching circuits connected to taps along the delay lines may have their outputs connected in parallel. In accordance with the enabling or disabling of the successive switching circuits connected to the taps of the delay lines, direct current pulses appear in digit periods corresponding to the pattern of enabled switches. The direct current pulses from the word generator 15 are impressed on the microwave signals from the oscillator 12 in the hybrid junction 17.

The hybrid junction 17 may, for example, be a "magic T" wave guide structure such as that shown in Fig. 12.4–7 on page 643 of a text entitled "Principles and Applications of Wave Guide Transmission" by George C. Southworth, D. Van Nostrand Co., Inc., New York, 1950. The hybrid junction may also take the form described in an article entitled "Directional Couplers" by W. W. Mumford, Proceedings of the I. R. E., February 1947, at page 160. Other known hybrid junctions may also be employed. Four wave guides are normally intercoupled by a hybrid junction, and they constitute two conjugate arms of the junction. When microwave energy is applied to one wave guide of a first pair of conjugate arms of the hybrid junction, it divides equally between the two arms of the other conjugate pair of wave guides, and no energy is coupled to the other arm of the first pair of conjugate arms.

When no bias is applied to diodes 23 and 24 associated with two conjugate arms of hybrid 17, microwave energy from oscillator 12 is reflected equally and in phase from the two crystals, and no microwave energy is coupled to wave guide 22. However, when pulses from word generator 15 are applied to crystal 24, its impedance state is changed with respect to that of crystal 23, and a pulse of microwave energy appears on wave guide 22. Accordingly, the train of microwave pulses 21 corresponds to the direct current pulses at the output of word generator 15. Similarly, microwave pulses are applied to wave guide 26 from hybrid junction 18, in accordance with the direct current pulse output of word generator 16. The digital information developed by word generator 16 is in general different from that produced by word generator 15. However, the timing of the individual digits in the microwave pulse trains in wave guides 22 and 26 is synchronized by the common triggering pulses provided by the synchronizing source 14.

The microwave pulses in wave guides 22 and 26 are amplified by the amplifiers 28 and 29 which may, for example, be traveling wave tubes. Traveling wave tubes or similar broad-band amplifiers which employ the drift time of electrons to obtain amplification may be employed to amplify the microwave pulses.

The exclusive-Or circuit per se which lies to the right of the vertical dash-dot line 11 will now be considered in detail. The central component of the exclusive-Or circuit is the hybrid junction 31. A microwave oscillator 32 is connected to one arm 33 of the hybrid junction 31, and the output circuit 34 is connected to the arm which is conjugate with respect to arm 33. Crystal diodes 35 and 36 are located in the other pair of conjugate arms 37 and 38 of the junction 31. The diodes 35 and 36 are normally biased in the low resistance state by the voltage sources 39 and 40. The voltage sources are coupled to the diodes 35 and 36 by the variable resistors 41 and 42, respectively.

With the diodes 35 and 36 properly biased in the low resistance direction to match the impedance of wave guides 37 and 38, microwave signals from the oscillator 32 are absorbed in the hybrid junction 31. Although it is desirable that diodes 35 and 36 be biased to an impedance match, it is sufficient that they be biased equally so that microwave energy is reflected back to wave guide 33. When control signals derived from one of the wave guides 22 or 26 are applied to the crystals 35 or 36, however, the balance is upset, and signal energy is coupled to output wave guide 34.

The control circuit for applying signals from wave guide 22 to the control diode 35 includes the diode detector 45 near the end of wave guide 22 and the resistor 46, which is connected in parallel with diode 45. The capacitor 47 couples the brief positive direct current pulses from the detection diode 45 to the control diode 35. When the positive pulse is applied to control diode 35, it is biased to the high resistance state, in which it permits transmission of microwave energy with little or no loss. Energy applied from junction 31 to wave guide 37 is then reflected back to the hybrid junction 31 from the end of wave guide stub 37. With diode 36 still in the low resistance state, little signal energy is reflected back from wave guide 38. Accordingly, the microwave energy reflected back from wave guide arm 37 is divided between wave guides 33 and 34. Pulse signals corresponding to those on wave guide 22 therefore appear at output wave guide 34. Similarly, when pulses are present on wave guide 26 and no pulses are present on wave guide 22, microwave pulses appear in output wave guide 34, in accordance with the pulse pattern in wave guide 26.

When both wave guides 22 and 26 have microwave pulses present, control diodes 35 and 36 are both driven to the high resistance state. Under these conditions, energy is reflected from wave guides 37 and 38 at equal signal levels, and combines in phase to couple only to wave guide 33, in accordance with the well known principles of operation of hybrid circuits. To insure the same energization level of control diodes 35 and 36, limiter circuits may be provided. The limiter circuit for diode 35 includes the additional diode 51 and the limiter biasing source 52. Similarly, the additional diode 53 and biasing source 54 provide limiting action for the diode 36. When positive pulses from wave guides 22 and 26 exceed the value of the limiter voltages 52 and 54, the diodes 51 and 53 will conduct and prevent further increase of the control signals. The diodes 35 and 36 are therefore energized to the same level by signal pulses on wave guides 22 and 26, and thus have the same impedance even though the microwave signals have different signal intensity levels.

The exclusive-Or circuit of Fig. 2 is similar to that of Fig. 1. The circuital components of Fig. 2 which correspond with those of Fig. 1 have therefore been designated by the same reference numerals.

In the circuit of Fig. 2, however, the microwave input signal to the hybrid junction 31 is derived from hybrid junctions 61, 62, and 63 instead of from the separate microwave oscillator 32, as in Fig. 1. Specifically, microwave signal energy from wave guide 22 divides in hybrid junction 61, with one half of the energy being applied to energize the diode detector 45 and the other half being applied to the hybrid 62. Similarly, energy applied to hybrid junction 63 from wave guide 26 is divided between the associated diode detector and the hybrid junction 62. Microwave energy from either of the hybrid junctions 61 or 63 which is applied to hybrid junction 62 is, of course, coupled to wave guide 33. With the exception of the origin of the microwave signals on wave guide 33, the mode of operation of the exclusive-Or circuit of Fig. 2 is substantially the same as set forth above in connection with Fig. 1.

Concerning the use of the terms "exclusive-Or," "anticoincidence," and "matching" circuits, the term "matching" circuit is normally employed when an output pulse results from like input signals. The designations "exclusive-Or," or "anticoincidence" circuits, however, are employed to indicate a system in which an output pulse results from the presence of only one of the input signals. In a strict sense, therefore, the matching circuit differs from the exclusive-Or or anticoincidence circuit by the use of an inversion or negation circuit in the output or one input of the logic circuit in question. In view of the slight difference between the two types of circuits, the terms are commonly used interchangeably, and are so used in the present specification and claims.

It is to be understood that the above-described arrangements are illustrative of the application of the principles of the invention. Numerous other arrangements may be devised by those skilled in the art without departing from the spirit and scope of the invention.

What is claimed is:

1. In an exclusive-Or circuit, a wave guide hybrid junction having two pairs of conjugate arms extending therefrom, first and second diodes located respectively in the arms of one of said pairs, means for supplying microwave energy to one of the arms of said other pair, first and second wave guides, a first detector coupled to detect microwave energy in said first wave guide and connected to apply the resulting pulses to said first diode to change its impedance, a second detector coupled to detect microwave energy in said second wave guide and connected to apply the resulting pulses to said second diode to change its impedance, first and second sources of trains of microwave pulses having different pulse patterns coupled to said first and second wave guides respectively, and means for synchronizing the timing of individual pulses in the pulse trains from said first and second pulse sources.

2. A matching circuit comprising a first wave guide hybrid junction having two pairs of conjugate arms extending therefrom, first and second diodes located respectively in the arms of one of said pairs, means for supplying microwave energy to one of the arms of said other pair, first and second wave guides, a first detector coupled to detect microwave energy in said first wave guide and connected to apply the resulting signal to said first diode to change its impedance, a second detector coupled to detect microwave energy in said second wave guide and connected to apply the resulting signal to said second diode to change its impedance, and first and second means each including a source of electromagnetic wave energy for applying trains of pulses having different pulse patterns to said first and second wave guides respectively.

3. In an exclusive-Or circuit, a first wave guide hybrid junction having two pairs of conjugate arms extending therefrom, first and second diodes located respectively in the arms of one of said pairs, means for supplying microwave energy to one of the arms of said other pair, first and second wave guides, a first detector coupled to detect microwave energy in said first wave guide and connected to apply the resulting signal to said first diode to change its impedance, a second detector coupled to detect microwave energy in said second wave guide and connected to apply the resulting signal to said second diode to change its impedance, and first and second sources of electromagnetic wave energy for applying different microwave signals to said first and second wave guides respectively.

4. A combination as defined in claim 3 wherein said microwave energy supplying means is a microwave oscillator connected to said hybrid junction.

5. A combination as defined in claim 3 wherein said microwave energy supplying means comprises connections from said first and second wave guides.

6. In an exclusive-Or circuit, a first wave guide hybrid junction having two pairs of conjugate arms extending therefrom, first and second identical diodes located respectively in the arms of one of said pairs, means for supplying microwave energy to one of the arms of said other pair, first and second wave guides, a first detector coupled to detect microwave energy in said first wave guide and connected to apply the resulting pulses to said first diode to change its impedance, a second detector coupled to detect microwave energy in said second wave guide and connected to apply the resulting pulses to said second diode to change its impedance, first and second sources of electromagnetic wave energy for applying different trains of pulses to said first and second wave guides respectively, and means for limiting the amplitude of said pulses.

7. A matching circuit comprising a first wave guide junction having two pairs of conjugate arms extending therefrom, first and second identical diodes located respectively in the arms of one of said pairs, means for supplying microwave energy to one of the arms of said other pair, first and second wave guides, a first detector coupled to detect microwave energy in said first wave guide and connected to apply the resulting pulses to said first diode to change its impedance, a second detector coupled to detect microwave energy in said second wave guide and connected to apply the resulting pulses to said second diode to change its impedance, first and second sources of electromagnetic wave energy for applying different trains of pulses to said first and second wave guides respectively, and means including additional biased diodes for limiting the amplitude of said pulses.

8. A microwave logic circuit comprising a hybrid junction having a first and a second pair of conjugate arms, a source of microwave energy connected to one arm of said first pair, output means connected to the other arm of said first pair, diode means connected to the arms of said second pair, means normally biasing said diode means to cause said arms to present equal impedances to said hybrid junction, and means for applying logic signals individually to said diode means connected to each of said arms of said second pair to alter the impedance of said arms.

9. A microwave logic circuit in accordance with claim 8 further comprising means for limiting the amplitude of said logic signals whereby said arms still present equal impedances to said hybrid junction when said signals are applied to both of said diode means.

10. A microwave logic circuit comprising a hybrid junction having a first and a second pair of conjugate arms, a source of microwave energy connected to one arm of said first pair, output means connected to the other arm of said first pair, diode means connected to the arms of said second pair, means normally biasing said diode means to cause said arms to present equal impedances to said hybrid junction, means for applying a first train of pulses representing digital signal information to the diode means connected to one of said arms to alter the impedance of said arm, means for applying a distinctly different train of pulses representing digital signal information to the diode means connected to the other of said arms to alter the impedance of said arm, and means for synchronizing the timing of the individual digits represented by said pulse trains.

11. In combination, a hybrid coupling circuit having first and second pairs of conjugate circuits, a source of radio frequency energy connected to one circuit of said first pair, output means connected to the other circuit of said first pair, individual diode means connected respectively to each of the two circuits of said second pair, means for connecting said diode means to said circuits to present equal impedances to said hybrid coupling circuit, means for applying a first train of pulses representing digital signal information to the diode means connected to one of said circuits to alter the impedance of said circuit, means for applying a distinctly different train of pulses representing digital signal information to the diode means connected to the other of said circuits of said first pair to alter the impedance of said circuit, and means for synchronizing the timing of the individual digits represented by said pulse trains.

References Cited in the file of this patent

UNITED STATES PATENTS

| | | |
|---|---|---|
| 2,439,651 | Dome | Apr. 13, 1948 |
| 2,787,673 | Cutler | Apr. 2, 1957 |
| 2,792,495 | Carpenter | May 14, 1957 |

FOREIGN PATENTS

| | | |
|---|---|---|
| 153,733 | Australia | Oct. 21, 1953 |